United States Patent
Maly et al.

(10) Patent No.: US 7,574,341 B1
(45) Date of Patent: Aug. 11, 2009

(54) SPECULATIVE EXPECTATION BASED EVENT VERIFICATION

(75) Inventors: John Warren Maly, LaPorte, CO (US); Ryan Clarenc Thompson, Loveland, CO (US); Zachary Steven Smith, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 816 days.

(21) Appl. No.: 10/712,855

(22) Filed: Nov. 12, 2003

(51) Int. Cl.
  *G06F 17/50* (2006.01)
  *G06F 9/455* (2006.01)
  *G06G 7/48* (2006.01)
  *G06F 13/00* (2006.01)
  *G06F 13/28* (2006.01)

(52) U.S. Cl. .............................. 703/13; 711/137; 703/23

(58) Field of Classification Search .................. 703/13, 703/23; 711/137
See application file for complete search history.

(56) References Cited

U.S. PATENT DOCUMENTS

| | | | | |
|---|---|---|---|---|
| 5,721,855 A | * | 2/1998 | Hinton et al. | 712/218 |
| 5,812,811 A | * | 9/1998 | Dubey et al. | 712/216 |
| 5,835,704 A | * | 11/1998 | Li et al. | 714/42 |
| 5,919,256 A | * | 7/1999 | Widigen et al. | 712/218 |
| 5,948,100 A | * | 9/1999 | Hsu et al. | 712/238 |
| 6,345,371 B1 | * | 2/2002 | Lam | 714/719 |
| 6,412,046 B1 | * | 6/2002 | Sharma et al. | 711/137 |
| 2002/0083271 A1 | * | 6/2002 | Mounes-Toussi | 711/133 |
| 2003/0177320 A1 | * | 9/2003 | Sah et al. | 711/158 |
| 2003/0226123 A1 | * | 12/2003 | Thompson et al. | 716/4 |
| 2003/0229740 A1 | * | 12/2003 | Maly et al. | 710/107 |
| 2004/0003175 A1 | * | 1/2004 | Maly et al. | 711/128 |
| 2004/0010781 A1 | * | 1/2004 | Maly et al. | 717/143 |
| 2004/0109362 A1 | * | 6/2004 | Gongwer et al. | 365/200 |

FOREIGN PATENT DOCUMENTS

GB 2390919 A * 1/2004

OTHER PUBLICATIONS

Eric Brewer, "Speculative Execution" Advanced Topics in Computer Systems, 4 pages, http://www.cs.berkeley.edu/~brewer/cs262/Lec-Speculator.pdf.*
U.S. Appl. No. 10/712,902 "Expectation Based Event Verification" of John W. Maly et al. filed Nov. 12, 2003.
U.S. Appl. No. 10/712,518 "Partial Write Data Tracking During Expectation Based Event Verification" of John W. Maly et al. filed Nov. 12, 2003.

* cited by examiner

*Primary Examiner*—Kamini S Shah
*Assistant Examiner*—David Silver

(57) ABSTRACT

A computer implemented method of verifying events generated by an agent includes detecting a stimulus at an input of the agent and determining whether generation of an event by the agent in response to the stimulus is conditional. An expectation of the event is created based at least in part on the stimulus, wherein the agent is expected to generate the event. The method also includes making the expectation speculative if the generation of the event is conditional.

16 Claims, 2 Drawing Sheets

SPECULATIVE EXPECTATION BASED EVENT VERIFICATION

BACKGROUND

Designing and testing a computer architecture is an extremely complex process, involving a range of tasks from the high level such as specifying the architecture down to the low level such as determining the physical placement of transistors on a silicon substrate. Each stage of the design process requires extensive testing and verification of the design through that stage. The computer architecture is typically simulated during the design process before building and testing the hardware.

The testing process is complicated further for architectures supporting multiple cache memories. For example, a computer architecture may support multiple processors having either a shared memory, multiple dedicated memories, or both, as well as multiple cache memories (referred to hereinafter simply as caches). Multiple memory agents are also provided to handle memory operations or transactions in the system that access the shared memory or other memories and the caches. For example, one of the processors may initiate a read transaction to read a line of memory. The line of memory may be stored in one or more locations in the system, such as in the shared memory and in one or more of the caches. The memory agents work together to determine the source from which the line of memory should be read for the processor.

The memory agents and memories may be connected in a number of ways, such as by a bus or by a point to point link network using any of a number of suitable protocols. A single memory transaction may therefore be quite complex, involving requests and data being sent back and forth among the multiple memory agents, memories and caches. The sequence of data transmissions depends upon the type of transaction (read, write, etc.), the locations and states of the line of memory in the system, the bus protocol employed, etc. Therefore, testing the operation of the memory agents in the system can be an extremely complex and data-intensive procedure.

SUMMARY

An exemplary embodiment may comprise a computer implemented method of verifying events generated by an agent, including detecting a stimulus at an input of the agent and determining whether generation of an event by the agent in response to the stimulus is conditional. An expectation of the event is created based at least in part on the stimulus, wherein the agent is expected to generate the event. The method also includes making the expectation speculative if the generation of the event is conditional.

Another exemplary embodiment may comprise an apparatus for verifying events whose performance by a memory agent is conditional, the apparatus including at least one computer readable medium having computer readable program code stored thereon. The computer readable program code includes program code for reading an input signal at an input of the memory agent, program code for generating a speculative expectation for an output signal based on the input signal, wherein the memory agent is expected to generate the output signal if at least one condition is satisfied, program code for reading at least one additional input signal at the input to determine whether the at least one condition is satisfied, and program code for promoting the speculative expectation to a non-speculative expectation if the condition is satisfied.

Another exemplary embodiment may comprise an apparatus for testing the operation of a memory agent. The apparatus includes means for generating a speculative expectation of an event to be conditionally generated by the memory agent, means for determining whether at least one condition is satisfied indicating that the memory agent should generate the event, and means for promoting the speculative expectation to a non-speculative expectation if the condition is satisfied.

BRIEF DESCRIPTION OF THE DRAWINGS

Illustrative embodiments are shown in the accompanying drawings, in which.

DESCRIPTION

Figure 1:
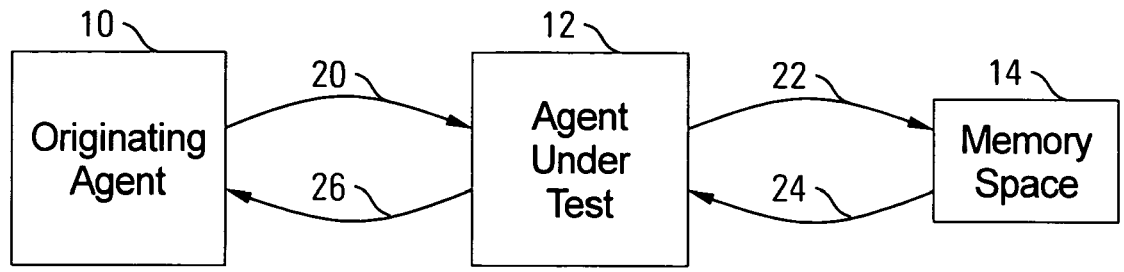
FIG. 1 is a block diagram of an exemplary group of memory agents in a computer system and an exemplary local read memory operation in the group.

The drawing and description, in general, disclose a method and apparatus for speculative expectation-based event verification in a memory agent checker. The checker verifies proper operation of a memory agent in a computer system, and may operate as described in U.S. patent application Ser. No. 10/712,902, entitled "EXPECTATION BASED EVENT VERIFICATION" filed concurrently herewith, and U.S. patent application Ser. No. 10/712,518, entitled "PARTIAL WRITE DATA TRACKING DURING EXPECTATION BASED EVENT VERIFICATION" filed concurrently herewith, which are both incorporated herein by reference for all that they contain. The checker tests the memory agent by monitoring the inputs to the memory agent and generating expectations for events which should occur at the outputs of the memory agent. This enables black-box style testing of the agent, without requiring that the internal state of the agent be probed. The inputs and outputs of the agent are monitored, and as portions of a memory transaction are received by the agent, certain events may be expected to be transmitted from the agent in response.

Transaction records are established by the checker to hold data relating to a transaction, and expectation records are established to hold data relating to an expected event generated by the agent. Transaction records and their associated expectation records are stored in data structures. During architectural testing of a system in which the agent is located, the operation of the agent may be tested simply by monitoring the inputs and outputs (I/O) of the agent and using transaction records and associated expectation records to verify that the agent is handling transactions properly.

The term "agent" is used herein to refer to any component of a system that receives incoming signals or transactions and generates outgoing signals or events as a result, wherein expected values or states of the outgoing signals may be determined based on the incoming transactions, possibly in connection with other information, before the actual outgoing signals are generated by the agent. In one exemplary embodiment, the agent comprises a memory agent in a computer system.

A transaction, as the term is used herein, corresponds to an entire memory operation, and starts with a request from an originating agent to perform the memory operation. The transaction may also include snoops, read requests, and responses, etc., for a read operation, or analogous messages for other types of memory operations. The transaction ends when the memory operation is complete. In one exemplary embodiment, this is indicated when the originating agent sends a completion message.

The testing tool, or checker, for monitoring the I/O of the agent and for generating and using the transaction records and expectation records may be implemented in any suitable manner, such as in a software application or in an electronic circuit. In one exemplary embodiment, the checker is written as a software application using the C++ programming language. The checker may be used to test agents during architectural verification at any stage, including in a software simulation of an architecture and a test of actual hardware. The transaction records and expectation records may be stored in any data structure suitable for maintaining the relationship described herein. In the exemplary embodiment of the checker, transaction records are stored in a transaction list vector. The vector is a container template, defined in the C++ Standard Template Library (STL), that resembles a C++ array in that it holds zero or more objects of the same type. The vector container is defined as a template class, meaning that it can be customized to hold objects of any type. Each of these objects may be accessed individually, using an iterator to step through the vector. The transaction list vector is dynamically expandable by adding new transaction records to the end of the vector. Each transaction record contains an expectation list vector for storing expectation records associated with that transaction record.

When a new transaction is detected at the input of the agent, a transaction record is created and is added to the transaction list vector. When an event expectation is generated, that is, when enough information is available to determine that an event should be generated by the agent, an expectation record is added to the expectation list vector for the appropriate transaction record. For example, if the agent receives a request to read a line of memory in a region belonging to that agent, the checker may expect to see a read request sent from the agent to a cache connected to the agent (referred to herein as a "local read"). In this example, a transaction record would be established for the memory read transaction, and an expectation record would be added to the expectation list vector in that transaction record, indicating that a read request should be sent from the agent to that cache. As will be discussed in detail below, if the cache returns the desired line of memory to the agent in a response to the local read, the checker adds another expectation record to the expectation list vector in that transaction record, indicating that the data in the response may be forwarded on by the agent to the originator of the transaction. In this case, the expectation is speculative, because the data retrieved by the local read may not be forwarded on by the agent to the originator of the transaction if fresher, more recent, data is available from another source for certain types of read operations.

The term "stimulus" is used herein to refer generally to any input to an agent under test for which an output from the agent under test may be expected by the checker, that is, for which an expectation may be generated by the checker. This includes, for example, an initial request to perform a memory operation, the responses to snoops by the agent under test, and the responses to reads from a memory space local to the agent under test. The term "event" is used herein to refer to any output from the agent under test, which generally should be triggered by a "stimulus". Thus, the "stimulus" is the input to the agent under test which triggers an outgoing "event".

When an event takes place, that is, when the checker detects an outgoing event from the agent, the transaction is identified, and the checker searches the transaction list vector to find the appropriate transaction record. The transaction may be identified in any suitable manner. In many instances, the event may contain a transaction identification (ID). In other instances, if the event does not contain a transaction ID, the checker identifies the transaction using other information in the system such as an indication of what transaction is current, or an indication in the event of what line of memory is being accessed. For example, if the transaction ID is not directly available from an outgoing event, the checker may use a C++ STL map to look up transaction ID's from information contained in the outgoing event or elsewhere.

If no transaction record is found for the outgoing event in the transaction list vector, the checker signals an error, indicating that an event has occurred without having been triggered by a stimulus.

If the transaction record is found in the transaction list vector, the expectation list vector is traversed, looking for an expectation record matching the detected event. If none is found, the checker signals an error, indicating that an unexpected event has occurred. If a match is found, the match may be logged and the expectation record may be deleted from the expectation list vector.

An exemplary system including a memory agent being tested, and several read operations in that system, will now be described. The first of the exemplary read operations to be described will be a local read operation, for which a definite expectation is generated by the checker. The second of the exemplary read operations to be described will be a general read operation, for which a speculative expectation is generated by the checker. These exemplary read operations are described to illustrate and contrast the conditions in the system that lead to definite expectations and speculative expectations. It is important to note, however, that the memory system described herein is purely exemplary and that a speculative expectation based event verification in a checker may be adapted for use with any configuration of agents. Similarly, the memory protocol described herein is also purely exemplary and speculative expectations may be adapted for use with other memory protocols. Furthermore, speculative expectations may be generated in other situations than for the local read response during a general memory read transaction described herein.

Figure 2:
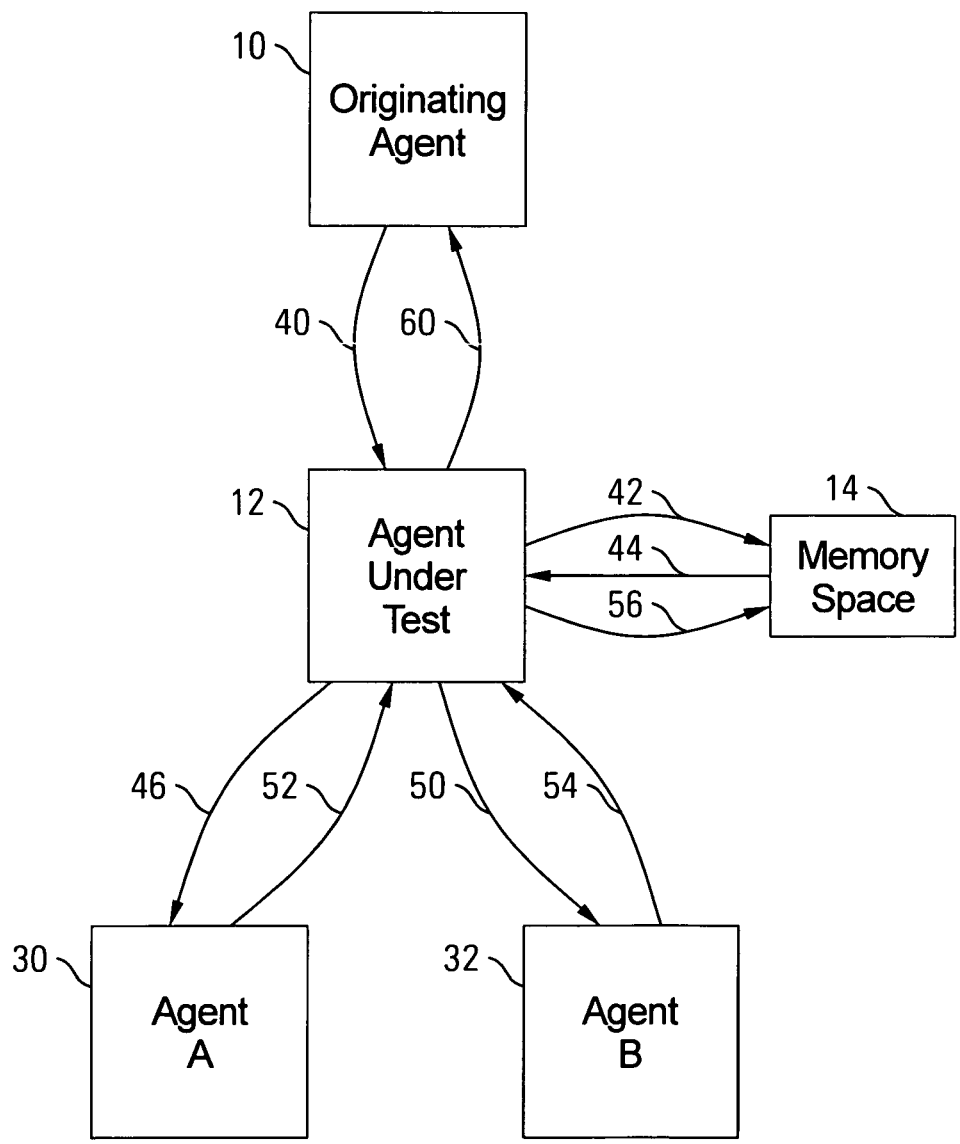
FIG. 2 is a block diagram of an exemplary group of memory agents in a computer system and an exemplary read memory operation in the group.

Referring now to FIGS. 1 and 2, a group of agents 10, 12, 30 and 32 in a computer system is shown. The agents 10, 12, 30 and 32 may be interconnected by a bus (not shown) or other type of interface. The checker described herein may be used to test an agent connected to other devices in a system by any bus, interface, or protocol or by any combination of buses, interfaces, or protocols in which an agent receives stimuli and transmits events based on these stimuli. In the exemplary embodiment, the agents 10, 12, 30 and 32 are interconnected by a point-to-point (P2P) link network.

A P2P link network is a switch-based network which may have one or more crossbars (not shown) acting as switches between components such as memory agents, memories, processor cores, or other devices. Messages in transactions are directed to specific components and are routed appropriately in the P2P link network by crossbars. This reduces the load on components because they don't need to examine each broadcast block of information as they would if connected by a bus. Messages in the P2P link network need not occur in any specific order. Transactions on the P2P link network are packet-based, with each packet containing a header with routing and other information. Packets containing requests, responses, and data are multiplexed, so portions of various transactions may be interspersed with many others in time. Transmissions are length-limited, with each length-limited block of data called a flit. Thus, a long packet will be broken into several flits, and transactions typically require multiple packets.

Referring now specifically to FIG. 1, an exemplary local read memory operation will be described. During the local read operation, the Originating Agent 10 begins a transaction by sending an original request 20 for a line of memory to an Agent Under Test 12. The Originating Agent 10 may comprise, for example, a processor that is attempting to read a line of memory such as an instruction to be executed. The Agent Under Test 12 transmits a message 22 to a connected memory space 14 such as a cache, requesting the line of memory, and the memory space 14 returns the line of memory 24 to the Agent Under Test 12. The Agent Under Test 12 then sends a copy 26 of the line of memory to the Originating Agent 10. Because this exemplary memory operation is a local read operation, the Agent Under Test 12 must return the line of memory 24 to the Originating Agent 10, so a checker monitoring the inputs and outputs of the Agent Under Test 12 should generate an expectation of the event in which the line of memory 24 is transmitted to the Originating Agent 10.

In this exemplary operation, the Agent Under Test 12 receives two incoming stimuli for which expectations may be generated. First, the original request 20 may result in an expectation being generated for the local read request 22 to the memory space 14. Second, the response 24 from the memory space 14 to the Agent Under Test 12 containing the line of memory may result in an expectation for the transmission 26 of the line of memory from the Agent Under Test 12 to the Originating Agent 10.

In the first stimulus, when the checker detects the original request 20 from the Originating Agent 10 at an input to the Agent Under Test 12, the checker determines whether the transaction is new, and if so, adds a transaction record to the transaction list vector. The checker attempts to determine what events should be generated by the Agent Under Test 12 as a result of the stimulus. An expectation record is generated and added to the transaction record for the current transaction, indicating that a local read request 22 should be sent from the Agent Under Test 12 to the memory space 14. As the checker detects the event 22, the checker identifies the transaction ID for the event from the event or other sources and searches the transaction list vector for the transaction record. The checker then searches the expectation list vector in the transaction record for the expectation record corresponding to the outgoing event. Information in the event is checked or verified as appropriate, such as the address of the line of memory sought, and the expectation record may be deleted or otherwise marked as complete if all was successful, or errors are signaled as appropriate.

The second stimulus to be considered is the reception of the line of memory 24 from the memory space 14 by the Agent Under Test 12. In this stimulus, the checker determines that the Agent Under Test 12 is expected to transmit 26 the line of memory to the Originating Agent 10. An expectation record is generated and added to the transaction record for the current transaction, indicating that the transmission 26 of the line of memory from the Agent Under Test 12 to the Originating Agent 10 is expected. As the checker detects the event 26, the checker identifies the transaction ID for the event from the event or other sources and searches the transaction list vector for the transaction record. The checker then searches the expectation list vector in the transaction record for the expectation record corresponding to the outgoing event. Information in the event is checked or verified as appropriate, such as the address of the line of memory sought, and the expectation record is deleted if all was successful, or errors are signaled as appropriate.

As will be described in more detail below, the checker tests only the Agent Under Test 12, and does not anticipate responses from other devices. Therefore, the line of memory 24 from the memory space 14 is not expected and is treated as an incoming stimulus for which a new expectation may be generated if appropriate. In other words, the checker is not waiting for this response, because it is not designed to detect failures in other devices such as the memory space 14. However, the checker does determine the context of stimuli as they are received before generating expectations. For example, in this example, when the line of memory 24 is received from the memory space 14 at the Agent Under Test 12, the checker looks through the associated transaction record, learning that the original request 20 was for a local read operation and thereby determining that the line of memory must be transmitted 26 to the Originating Agent 10.

Referring now to FIG. 2, another exemplary memory operation will be described. In this case, the memory operation is a general read operation, not a local read operation, so the Agent Under Test 12 will seek out the most recent copy of the line of memory in the system. The Originating Agent 10 begins the transaction by sending an original request 40 for a line of memory to an Agent Under Test 12. The Agent Under Test 12 queries any other devices in the system that may have a copy of the line of memory in order to obtain the most recent version for the Originating Agent 10. In this exemplary operation, the Agent Under Test 12 transmits a message 42 to the local memory space 14, requesting the line of memory, and the memory space 14 returns the line of memory 44 to the Agent Under Test 12, where it is temporarily stored internally. The Agent Under Test 12 concurrently sends snoops 46 and 50 to other agents 30 and 32, respectively, in the system, requesting the line of memory from them. Agent A 30 replies with an "Invalid" message 52, indicating that the line of memory is not stored in Agent A 30 or its associated memory space (not shown). In this example, the line of memory was stored in modified form in the memory space (not shown) associated with Agent B 32. Therefore, Agent B 32 obtains the modified copy of the line of memory, either from its internal cache or in its associated memory space (not shown), and transmits the modified line of memory 54 to the Agent Under Test 12. The Agent Under Test 12 receives the modified line of memory 54 and overwrites its internal copy of the line of memory with the received modified line 54. The Agent Under Test 12 then sends a copy 56 of the modified line of memory to its memory space 14 for storage, and sends another copy 60 of the modified line of memory to the Originating Agent 10.

Other messages (not shown) may be sent throughout the system during the memory operation, both related and unrelated to the memory operation, such as a completion message from the Originating Agent 10 to the Agent Under Test 12. Note that the sequence of transactions and events described for this memory operation is purely exemplary. The actual transactions and events involved in a memory operation are dependent on the configuration of the system, the types of interfaces between devices in the system, the type of memory operation, etc.

In this exemplary operation, the Agent Under Test 12 receives three incoming stimuli for which expectations may be generated. First, the original request 40 may result in three expectations being generated, expecting the read 42 and snoops 46 and 50 being transmitted to the memory space 14 and Agents A 30 and B 32. (Note that the generation of these three expectations depends on the checker having some information about the configuration of the system. In an alternative embodiment, the checker may not have this information, and would therefore not generate these expectations.)

Second, the response 44 from the local memory space 14 containing the line of memory may result in an expectation being generated, expecting the line of memory being transmitted to the Originating Agent 10. However, this expectation is speculative, because the line of memory from the local memory space 14 is clean or unmodified, and will only be send to the Originating Agent 10 if no fresher (modified) copy of the line of memory exists in the system.

Third, the response 54 from Agent B 32 containing the modified line of memory may result in two expectations being generated, expecting the modified line of memory being transmitted 56 and 60 to the local memory space 14 and the Originating Agent 10. As will be described in more detail below, reception of this response 54 from Agent B 32 containing the modified line of memory affects the speculative expectation that the clean line of memory 44 from the local memory space 14 should be transmitted to the Originating Agent 10. Note that the "Invalid" response 52 from Agent A 30 in this exemplary embodiment does not result in an event from the Agent Under Test 12. The reason that this exemplary embodiment of the checker does not need to wait for all snoop responses to arrive at the Agent Under Test 12 before acting on a modified response 54 is that the memory protocol in the exemplary embodiment does not allow multiple modified copies of a line of memory. For example, in a MESI (modified, exclusive, shared, invalid) memory protocol, there can only be one "current" (i.e., modified) copy of a line of memory in the system at any one time. In an alternative embodiment, in which multiple different modified copies of a line of memory may exist simultaneously, the checker needs to provide some version control to select the freshest or most recent modified copy. In this case, the checker may generate multiple speculative completions, and would not select the correct speculative expectation to promote until all necessary snoop responses had been received.

Note that in the exemplary embodiment described herein, even though a speculative expectation can be resolved as soon a modified snoop response is received, the transaction record should not deleted until all snoop responses have been received, or any "invalid" snoop responses that arrive later will appear to be orphans and may cause errors.

Again, this exemplary embodiment relies on the checker having information about the configuration of the system, and keeping track of the state of the transaction in the system. In alternative embodiments, the checker may have different levels of information and may generate different expectations accordingly.

As mentioned above, the checker tests only the Agent Under Test 12, and does not anticipate responses from other agents. (Note that other agents may be tested simultaneously or at other times using their own, independent, identical copies of the checker.) Therefore, the line of memory 44 from the memory space 14, the "Invalid" response 52 from Agent A 30, and the modified line of memory 54 from Agent B 32 are not expected and are treated as incoming stimuli for which new expectations may be generated if appropriate. In other words, the checker is not waiting for these responses, because it is not designed to detect failures in any component of the system but the Agent Under Test 12. Each of these responses from other components may or may not result in expected events, as discussed above. For example, the "Invalid" response 52 from Agent A 30 would not result in an outgoing event from the Agent Under Test 12 unless no copy of the line of memory was available from any source in the system, in which case the Agent Under Test 12 might send an "Invalid" message to the Originating Agent 10. Note that this "Invalid" message from the Agent Under Test 12 might be expected as an event because of either the "Invalid" response 52 from Agent A 30 or the original request 40 from the Originating Agent 10. The checker may be adapted in cases like these to generate expectations from either or both, as desired.

For the present discussion, only three stimuli will be considered, the original request 20 from the Originating Agent 10 to the Agent Under Test 12, the clean line of memory 44 from the memory space 14, and the modified line of memory 54 from Agent B 32.

In the first stimulus, when the checker detects the original request 40 from the Originating Agent 10 at an input to the Agent Under Test 12, the checker determines whether the transaction is new. In this case, it is, so the checker adds a transaction record to the transaction list vector. The checker attempts to determine what events should be generated by the Agent Under Test 12 as a result of the stimulus, based upon information in the stimulus and optionally from other information in the system. For example, the checker detects that the stimulus is a general request for a line of memory and that three sources should be checked for the line of memory, including the memory space 14 and the other two agents 30 and 32. Therefore, three expectation records are generated and added to the transaction record for the current transaction—a first read message 42 to the memory space 14, and snoops 46 and 50 to Agent A 30 and Agent B 32, respectively. As the checker detects each event 14, 46 and 50 at the output of the Agent Under Test 12, the checker identifies the transaction ID for each event from the event or other sources and searches the transaction list vector for the transaction record. The checker then searches the expectation list vector in the transaction record for the expectation record corresponding to the outgoing event. Information in the event is checked or verified as appropriate, such as the address of the line of memory sought. As each outgoing event is detected by the checker and the expectation record is located, the event is verified against the expectation record, and the expectation record is deleted or otherwise marked as complete if all was successful, or errors are signaled as discussed above.

Once a transaction is complete, the transaction record may also be deleted. However, note that the completion of all expected events does not necessarily indicate that the transaction is complete. Expectations for some events may not be discernable when the first stimulus of a transaction arrives at the agent. In other words, generation of expectations may continue at any time after the transaction begins until the transaction is officially complete, such as when the Originating Agent 10 indicates to the Agent Under Test 12 that the transaction is complete.

The second stimulus to be considered is the reception of the line of memory 44 from the memory space 14 by the Agent Under Test 12. The checker determines by referring to the transaction record for the stimulus that the original request was a general read request, so the line of memory 44 from the memory space 14 should be sent to the Originating Agent 10 by the Agent Under Test 12 if and only if no more recent copy of the line of memory exists in the system. The checker therefore generates an expectation of the transmission of the line of memory 44 from the Agent Under Test 12 to the Originating Agent 10. This expectation is marked as speculative, indicating to the checker that the expected event may or may not be generated by the Agent Under Test 12, depending upon whether a more recent copy of the line of memory exists in the system.

In this exemplary embodiment of the checker, the speculative expectation record is identical to other non-speculative expectation records except for the inclusion of a "speculative" boolean variable that is set to TRUE if the expectation is speculative and FALSE if the expectation is definite. The exemplary checker is implemented in software using the C++ programming language, and expectation records are instantiated as objects, with the "speculative" boolean set to FALSE by default in the constructor for the expectation record. Speculative expectation records may be implemented in any desired alternative fashion, although the disclosed exemplary embodiment does provide for convenient code reuse, simplifying program creation, testing and maintenance and minimizing code size.

The third stimulus to be considered is the reception of the modified line of memory 54 from Agent B 32 by the Agent Under Test 12. Based on this stimulus, the checker may determine that the Agent Under Test 12 is expected to transmit the modified line of memory to its associated memory space 14 and to the Originating Agent 10. The expectation records generated for these events may contain the modified line of memory, so that when the events are detected at the output of the Agent Under Test 12, the checker may verify that the modified line of memory was correctly transmitted. If the modified line of memory is transmitted in multiple units, such as multiple flits or packets, the checker may collect all units and verify them before deleting the expectation record.

In the exemplary checker, speculative expectations (such as that generated in response to the second stimulus discussed above) are resolved when the checker detects that the Agent Under Test 12 has received all required snoop responses (e.g., 52 and 54). If a modified response is detected, this data is "fresher" or more recent than the data from the local memory space 14. This data is thus saved in a new expectation (such as that generated in response to the third stimulus discussed above), and the speculative expectation is located and deleted. If, however, no modified response is detected when the Agent Under Test 12 has received all required snoop responses, the checker promotes the speculative expectation to a definite expectation by setting the "speculative" boolean in the expectation to FALSE.

Figure 3:
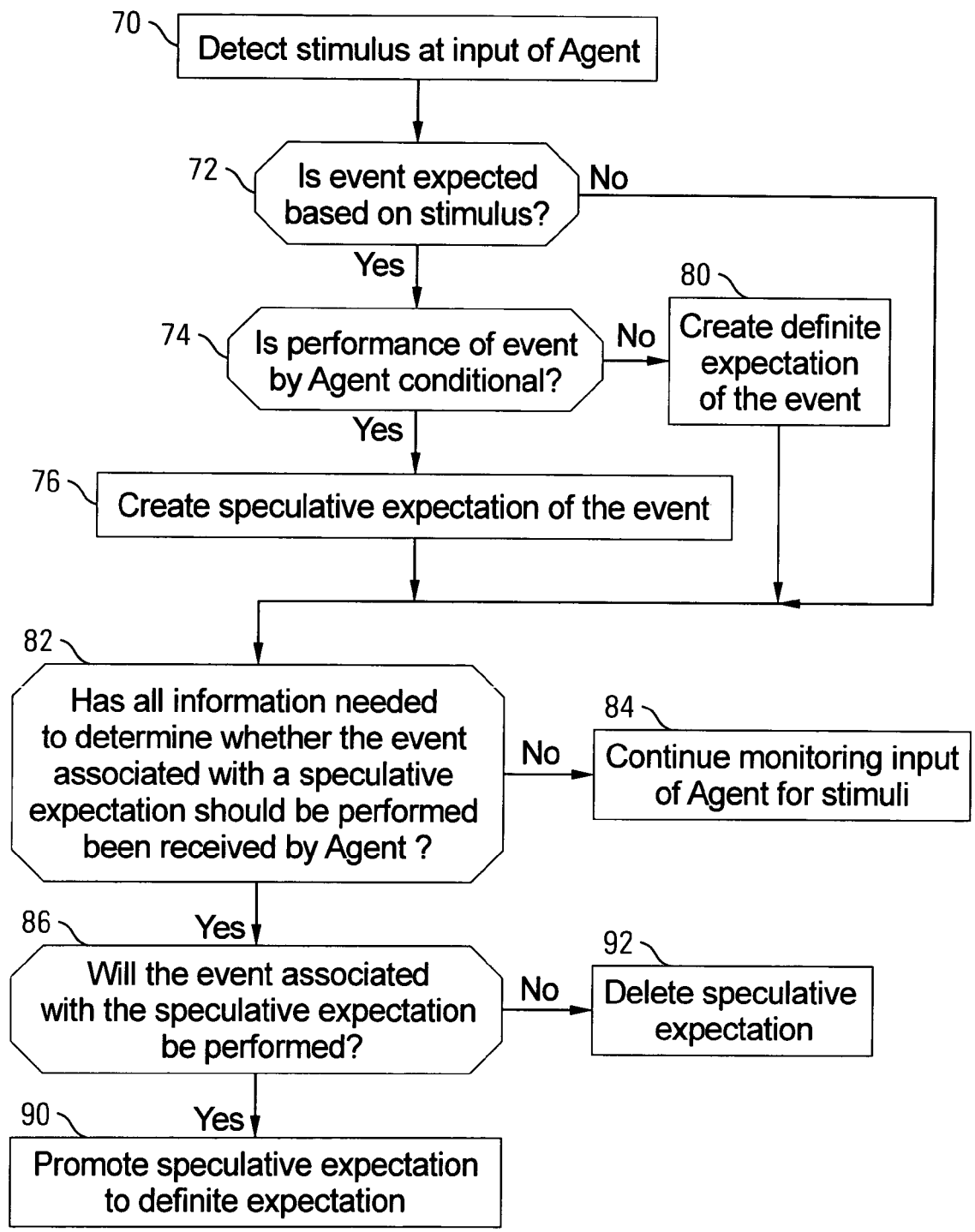
FIG. 3 is a flow chart of an exemplary operation for generating expectations for outgoing events, wherein the performance of events by the agent may be conditional.

An exemplary operation for speculative expectation-based event verification in a memory agent checker is summarized in the flowchart of FIG. 3. The checker monitors the input of the Agent Under Test 10 until a stimulus is detected 70. The checker contains rules reflecting the configuration of the system, the memory protocol, etc., which enable it to determine whether 72 an event will be generated by the Agent Under Test 10 in response to the stimulus. If 72 an event is expected, the checker determines 74 whether the performance of the event by the Agent Under Test 10 is conditional. If so, the checker creates 76 a speculative expectation of the event. If not, the checker creates 80 a definite expectation of the event. Each time a stimulus is received at the input of the Agent Under Test 12 by the checker, the checker can attempt to determine 82 whether enough information has been received to resolve any outstanding speculative expectations. (If not, the checker continues 84 to monitor the inputs to the Agent Under Test 12 for further stimuli.) If enough information has been received 82, (e.g., responses have been received for all snoop events from the Agent Under Test 12) the checker determines 86 whether the speculative expectation will be performed. If so 90, the speculative expectation is promoted to a definite expectation. (For example, if no modified responses were received, the speculative expectation for an event based on a local read response is made definite.) If not 92, the speculative expectation is deleted. (For example, if a modified response was received, the speculative expectation for an event based on a clean local read response would be deleted.)

In most cases, the checker would not expect to see an event generated by the Agent Under Test 12 while the associated expectation is still speculative. For example, the Agent Under Test 12 would typically not send clean data obtained in a local read response from the memory space 14 to the Originating Agent 10 before all snoop responses (e.g., 52, 54) were received by the Agent Under Test 12. However, depending on the system configuration, the memory protocol and the particular transaction type, there may be events that are appropriately generated by an agent while the associated expectation is still speculative. In this case, the event may be used as a cue to verify that the expectation is no longer speculative. Alternatively, the speculative expectation record may be updated to indicate that the associated event has occurred. If the expectation later becomes definite based on stimuli received by the agent or based on other information in the system, the checker is aware that the associated event has occurred because of the indication in the expectation record. If the speculative expectation becomes obsolete and would normally be deleted based on stimuli received by the agent or based on other information in the system, the checker is aware that the associated event has occurred because of the indication in the expectation record, and the checker may then signal an error indicating that the event should not have occurred.

The use of speculative expectations during expectation-based event verification provides several benefits. Transactions may be processed in real time, without waiting for further, future information to determine whether an expectation should be generated. Expectations are created as potentially needed and either promoted to definite expectations or deleted when more complete information is available, avoiding the need for delays and storage of complex state data while waiting for complete information on whether an event should occur.

Various computer readable or executable code or electronically executable instructions have been referred to herein. These may be implemented in any suitable manner, such as software, firmware, hard-wired electronic circuits, or as the programming in a gate array, etc. Software may be programmed in any programming language, such as machine language, assembly language, or high-level languages such as C or C++. The computer programs may be interpreted or compiled.

Computer readable or executable code or electronically executable instructions may be tangibly embodied on any computer-readable storage medium or in any electronic circuitry for use by or in connection with any instruction-executing device, such as a general purpose processor, software emulator, application-specific circuit, a circuit made of logic gates, etc. that can access or embody, and execute, the code or instructions.

Methods described and claimed herein may be performed by the execution of computer readable or executable code or electronically executable instructions, tangibly embodied on any computer-readable storage medium or in any electronic circuitry as described above.

A storage medium for tangibly embodying computer readable or executable code or electronically executable instructions includes any means that can store, transmit, communicate, or in any way propagate the code or instructions for use by or in connection with the instruction-executing device. For example, the storage medium may include (but is not limited to) any electronic, magnetic, optical, or other storage device, or any transmission medium such as an electrical conductor, an electromagnetic, optical, infrared transmission, etc. The storage medium may even comprise an electronic circuit, with the code or instructions represented by the design of the electronic circuit. Specific examples include magnetic or optical disks, both fixed and removable, semiconductor memory devices such as memory cards and read-only memories (ROMs), including programmable and erasable ROMs, non-volatile memories (NVMs), optical fibers, etc. Storage media for tangibly embodying code or instructions also include printed media such as computer printouts on paper which may be optically scanned to retrieve the code or instructions, which may in turn be parsed, compiled, assembled, stored and executed by an instruction-executing device. The code or instructions may also be tangibly embodied as an electrical signal in a transmission medium such as the Internet or other types of networks, both wired and wireless.

While illustrative embodiments have been described in detail herein, it is to be understood that the concepts disclosed herein may be otherwise variously embodied and employed, and that the appended claims are intended to be construed to include such variations, except as limited by the prior art.

What is claimed is:

1. A computer implemented method of verifying events generated by an agent, said method comprising:
    detecting a stimulus at an input of said agent;
    determining whether generation of an event by said agent in response to said stimulus is conditional;
    creating an expectation of said event based at least in part on said stimulus, wherein said agent is expected to generate said event;
    indicating that said expectation is speculative when said generation of said event is conditional, so that said expectation is a speculative expectation;
    converting said speculative expectation to a non-speculative expectation when conditions indicate that said even should be generated by said agent;
    deleting said speculative expectation when said conditions indicate that said event should not be generated by said agent;
    when said speculative expectation was converted to a non-speculative expectation, verifying whether said non-speculative event was generated by said agent signaling an error when said non-speculative event was not generated by said agent;
    when said speculative expectation was deleted, verifying whether said deleted speculative expectation was generated by said agent and signaling an error when said deleted speculative expectation was generated by said agent.

2. The method of claim 1, said determining whether said generation of said event is conditional comprising determining that said generation is conditional when said stimulus is a response containing an unmodified copy of requested data and other sources accessible by said agent may contain a modified copy of said requested data.

3. The method of claim 1, said determining whether said generation of said event is conditional comprising determining that said generation is conditional when said stimulus comprises a local read request response by a memory local to said agent.

4. The method of claim 1, further comprising determining whether said event is expected based at least in part on said stimulus before creating said expectation of said event.

5. The method of claim 1, further comprising determining whether all snoop responses have been received by said agent before said determining whether said generation is conditional.

6. The method of claim 1, wherein said conditions indicating that said event should be generated by said agent comprise said agent receiving all expected snoop responses, said expected snoop responses containing no modified data.

7. The method of claim 1, wherein said conditions indicating that said event should not be generated by said agent comprise said agent receiving a snoop response containing modified data.

8. The method of claim 1, said verifying comprising:
    detecting said event at an output of said agent; and
    checking said expectation to verify whether said agent correctly generated said event.

9. The method of claim 1, said verifying comprising:
    detecting an outgoing event at an output of said agent; and
    checking a list of expectations of events to verify whether said agent correctly generated said outgoing event.

10. The method of claim 1, wherein said generation of said event is conditional, said method further comprising:
    detecting an outgoing event at an output of said agent; and
    storing an indication that said outgoing event occurred in said speculative expectation.

11. The method of claim 10, further comprising:
    detecting information at said input of said agent indicating that said event corresponding to said speculative expectation should not be generated by said agent; and
    signaling an error indicating that said outgoing event should not have occurred.

12. An apparatus for verifying events whose performance by a memory agent is conditional, comprising:
    a. at least one physical computer readable medium; and
    b. computer readable program code stored on said at least one computer readable medium, said computer readable program code comprising:
        i. program code for reading an input signal at an input of said memory agent;
        ii. program code for generating a speculative expectation for an output signal based on said input signal, wherein said memory agent is expected to generate said output signal if at least one condition is satisfied;
        iii. program code for reading at least one additional input signal at said input to determine whether said at least one condition is satisfied;
        iv. program code for promoting said speculative expectation to a non-speculative expectation if said at least one condition is satisfied;
        v. program code for deleting said speculative expectation if said at least one condition is not satisfied;
        vi. program code for verifying whether said output signal is generated; and
        vii. program code for signaling an error if said output signal was not generated and said at least one condition was satisfied and for signaling an error if said output signal was generated and said at least one condition was not satisfied.

13. The apparatus of claim 12, wherein said input signal comprises a local read response containing an unmodified copy of requested data.

14. The apparatus of claim 12, said program code for deleting said speculative expectation comprising program code for deleting said speculative expectation when said memory agent receives a modified copy of requested data.

15. The apparatus of claim 12, wherein said condition comprises said memory agent receiving all expected snoop responses, none of which contain a modified copy of requested data.

16. An apparatus for testing the operation of a memory agent, said apparatus comprising tangibly embodied electronically executable instructions, said apparatus comprising:

means for generating a speculative expectation of an event to be conditionally generated by said memory agent;

means for determining whether at least one condition is satisfied indicating that said memory agent should generate said event;

means for promoting said speculative expectation to a non-speculative expectation if said condition is satisfied;

means for deleting said speculative expectation if said condition is not satisfied;

means for verifying whether said event was generated by said memory agent, thereby testing said operation of said memory agent; and means for signaling an error if said event was not generated by said memory agent and said condition was satisfied and for signaling an error if said event was generated by said memory agent and said condition was not satisfied.

\* \* \* \* \*

UNITED STATES PATENT AND TRADEMARK OFFICE
CERTIFICATE OF CORRECTION

PATENT NO. : 7,574,341 B1   Page 1 of 1
APPLICATION NO. : 10/712855
DATED : August 11, 2009
INVENTOR(S) : John Warren Maly et al.

It is certified that error appears in the above-identified patent and that said Letters Patent is hereby corrected as shown below:

On the title page, item (75), Inventors, in column 1, line 2, delete "Ryan Clarenc Thompson" and insert -- Ryan Clarence Thompson --, therefor.

Signed and Sealed this

Sixth Day of April, 2010

David J. Kappos
*Director of the United States Patent and Trademark Office*